United States Patent
Sumi et al.

(10) Patent No.: US 11,587,803 B2
(45) Date of Patent: Feb. 21, 2023

(54) SUBSTRATE PROCESSING APPARATUS

(71) Applicant: SCREEN Holdings Co., Ltd., Kyoto (JP)

(72) Inventors: Noritake Sumi, Kyoto (JP); Masanobu Sato, Kyoto (JP); Masayuki Orisaka, Kyoto (JP); Daiki Uehara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 167 days.

(21) Appl. No.: 16/910,019

(22) Filed: Jun. 23, 2020

(65) Prior Publication Data
US 2020/0411336 A1    Dec. 31, 2020

(30) Foreign Application Priority Data
Jun. 28, 2019  (JP) .............................. JP2019-121645

(51) Int. Cl.
| | | |
|---|---|---|
| H01L 21/67 | (2006.01) | |
| B08B 3/08 | (2006.01) | |
| B08B 5/00 | (2006.01) | |
| B08B 7/00 | (2006.01) | |

(52) U.S. Cl.
CPC ......... *H01L 21/67034* (2013.01); *B08B 3/08* (2013.01); *B08B 5/00* (2013.01); *B08B 7/0021* (2013.01)

(58) Field of Classification Search
CPC ......... H01L 21/67748; H01L 21/68785; H01L 21/67034; H01L 21/6719; B08B 5/00; B08B 7/0021; B08B 3/08
See application file for complete search history.

(56) References Cited

U.S. PATENT DOCUMENTS

| | | |
|---|---|---|
| 8,235,061 B2 | 8/2012 | Toshima et al. |
| 8,434,423 B2 | 5/2013 | Toshima et al. |
| 9,004,086 B2 | 4/2015 | Nixon et al. |
| 9,027,576 B2 | 5/2015 | Cho et al. |
| 9,076,643 B2 | 7/2015 | Toshima et al. |
| 9,881,784 B2 | 1/2018 | Ohno et al. |
| 10,199,240 B2 | 2/2019 | Hayashi et al. |
| 10,395,950 B2 | 8/2019 | Goshi et al. |

(Continued)

FOREIGN PATENT DOCUMENTS

| | | |
|---|---|---|
| JP | H09232271 | 9/1997 |
| JP | 2005277230 | 10/2005 |

(Continued)

*Primary Examiner* — Benjamin L Osterhout
(74) *Attorney, Agent, or Firm* — JCIPRNET (57) ABSTRACT

A substrate processing apparatus processes a surface of a substrate with a processing fluid and includes a support tray in which a concave part for housing the substrate is provided on an upper surface thereof; a storage container in which a cavity is formed, wherein the support tray may be stored in a horizontal posture in the cavity; and a fluid supply part supplying the processing fluid to the cavity, wherein the storage container has a flow path which receives the processing fluid and discharges the processing fluid in a horizontal direction into the cavity from a discharge port that opens on a side wall surface of the cavity and toward the cavity, and a lower end position of the discharge port in a vertical direction is the same as or higher than a position of the upper surface of the support tray stored in the cavity.

11 Claims, 5 Drawing Sheets

(56) References Cited

U.S. PATENT DOCUMENTS

| | | | |
|---|---|---|---|
| 10,692,739 B2 | 6/2020 | Kawabuchi et al. | |
| 2008/0230096 A1* | 9/2008 | Kawamura | H01L 21/67115 134/98.1 |
| 2010/0319615 A1* | 12/2010 | Higashijima | H01L 21/6708 118/50 |
| 2013/0028690 A1 | 1/2013 | Park et al. | |
| 2015/0020850 A1* | 1/2015 | Kato | H01L 21/02052 134/4 |
| 2015/0258584 A1 | 9/2015 | Mitsuoka et al. | |
| 2018/0138060 A1 | 5/2018 | Okamura et al. | |
| 2018/0233354 A1* | 8/2018 | Masuda | C23C 16/4584 |

FOREIGN PATENT DOCUMENTS

| | | |
|---|---|---|
| JP | 2006222468 | 8/2006 |
| JP | 2010161165 | 7/2010 |
| JP | 2010177551 | 8/2010 |
| JP | 2013033963 | 2/2013 |
| JP | 2014067955 | 4/2014 |
| JP | 2014175669 | 9/2014 |
| JP | 2018082043 | 5/2018 |
| JP | 2018147945 | 9/2018 |
| KR | 100880696 | 2/2009 |
| KR | 20110139461 | 12/2011 |
| KR | 20130014312 | 2/2013 |
| KR | 20140071947 | 6/2014 |
| KR | 20180050236 | 5/2018 |
| TW | 201030889 | 8/2010 |
| TW | 201118935 | 6/2011 |
| TW | 201312639 | 3/2013 |
| TW | 201545800 | 12/2015 |
| TW | 201627077 | 8/2016 |

\* cited by examiner

SUBSTRATE PROCESSING APPARATUS

CROSS REFERENCE TO RELATED APPLICATION

The disclosure of Japanese Patent Application No. 2019-121645 filed on Jun. 28, 2019 including specification, drawings and claims is incorporated herein by reference in its entirety.

BACKGROUND

1. Technical Field

The disclosure relates to a substrate processing apparatus that processes a surface of a substrate with a processing fluid.

2. Description of the Related Art

The process of processing various substrates such as a semiconductor substrate and a glass substrate for a display apparatus includes processing the surface of the substrate with various processing fluids. Although processing using liquids such as chemicals and rinses as the processing fluids has been widely performed in the past, processing using supercritical fluids has been put into practical use in recent years. In particular, in the processing of a substrate having a fine pattern formed on its surface, a supercritical fluid having a lower surface tension than a liquid penetrates deep into gaps among the pattern, whereby the processing may be performed efficiently. In addition, the risk of pattern collapse caused by the surface tension during drying may be reduced.

For example, Japanese Laid-open Publication No. 2018-082043 (Patent Document 1) describes a substrate processing apparatus that performs drying processing on a substrate using a supercritical fluid. In this apparatus, two plate-shaped members are disposed to face each other, and the gap therebetween serves as a processing space. Then, the wafer (substrate) placed on a thin plate-shaped holding plate is carried in from one end part of the processing space, and carbon dioxide in the supercritical state is introduced from the other end part.

According to the knowledge of the inventors of the disclosure, in processing such a substrate, it is preferable that the processing fluid flows as a laminar flow along the surface of the substrate. The reason is as follows. When such a laminar flow passes through the surface of the substrate, stirring of the fluid in the gaps among the pattern formed on the surface of the substrate is facilitated, and the processing efficiency is improved. In addition, since the deposits separated from the substrate are carried in one direction by the laminar flow, redepositing on the substrate is suppressed.

However, in the above conventional technique, the fluid is simply supplied from the side of the space in which the substrate is disposed, and formation of a laminar flow along the substrate surface is not taken into consideration. Rather, a turbulent flow may occur due to the supplied fluid colliding with the side surface of the substrate or the holding plate, and there is room for improvement in the above conventional technique in this respect.

The disclosure has been made in view of the above problems, and the disclosure provides a technique of a substrate processing apparatus that processes a surface of a substrate with a processing fluid, in which the substrate may be well processed by forming a stable laminar flow along the substrate surface to be processed.

SUMMARY

An aspect of the disclosure provides a substrate processing apparatus which processes a surface of a substrate with a processing fluid, and the substrate processing apparatus includes a support tray having a shape in which a concave part for housing the substrate is provided on an upper surface of a flat plate; a storage container in which a cavity having a shape corresponding to an outer shape of the support tray and having a ceiling surface that is a horizontal plane is formed, wherein the support tray housing the substrate in the concave part is capable of being stored in a horizontal posture in an internal space of the cavity; and a fluid supply part which supplies the processing fluid to the cavity, wherein the storage container is provided with a flow path which receives the processing fluid supplied from the fluid supply part and which discharges the processing fluid in a horizontal direction into the cavity from a discharge port that opens on a side wall surface of the cavity and toward the cavity, and a lower end position of the discharge port in a vertical direction is the same as or higher than a position of the upper surface of the support tray stored in the cavity.

In the disclosure configured in this way, the substrate is stored in the storage container in a state of being housed in the support tray. The cavity formed corresponding to the outer shape of the support tray is provided in the storage container, and the support tray and the substrate are stored in the internal space thereof. Since the ceiling surface of the cavity is a horizontal plane, the upper surfaces of the support tray and the substrate and the ceiling surface are parallel and closely face each other.

Then, the processing fluid is supplied in the horizontal direction from the discharge port provided on the side wall surface of the cavity, but the discharge port opens above the upper surface of the support tray. Therefore, the processing fluid discharged from the discharge port is discharged toward the upper surface of the support tray in the cavity and flows in the horizontal direction along the upper surface of the support tray in the space between the upper surface of the support tray and the ceiling surface of the cavity. Therefore, the processing fluid supplied to the upper surface side of the support tray flows as a stable laminar flow along the surface of the substrate near the surface of the substrate housed in the concave part on the upper surface of the support tray.

DESCRIPTION OF THE EMBODIMENTS

As described above, in the disclosure, the support tray that houses the substrate is stored in the cavity inside the storage container formed corresponding to the shape of the support tray. Then, the processing fluid is discharged in the horizontal direction from the discharge port that opens on the side wall surface of the cavity and above the upper surface of the support tray. Therefore, the processing fluid flowing near the substrate surface forms a laminar flow, and the substrate may be well processed.

The above and further objects and novel features of the disclosure will more fully appear from the following detailed description when the same is read in connection with the accompanying drawing. It is to be expressly understood, however, that the drawing is for purpose of illustration only and is not intended as a definition of the limits of the disclosure.

Figure 1:
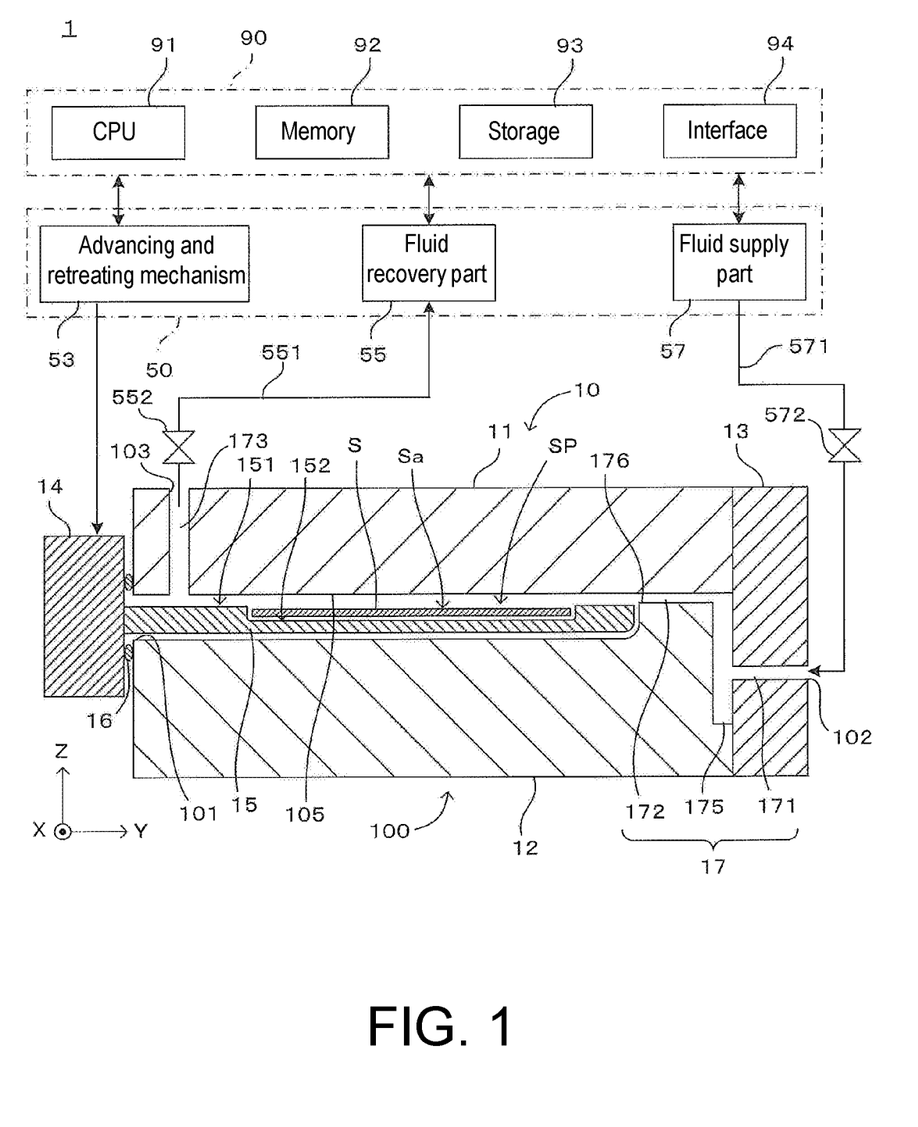
FIG. 1 is a view showing a schematic configuration of an embodiment of a substrate processing apparatus according to the disclosure.

FIG. 1 is a view showing a schematic configuration of an embodiment of a substrate processing apparatus according to the disclosure. This substrate processing apparatus 1 is an apparatus for processing surfaces of various substrates such as semiconductor substrates using a supercritical fluid. An XYZ orthogonal coordinate system is set as shown in FIG. 1 in order to uniformly indicate the directions in the following drawings. Here, the XY plane is a horizontal plane, and the Z direction represents the vertical direction. More specifically, the (−Z) direction represents the vertically downward direction.

Here, various substrates such as a semiconductor wafer, a photomask glass substrate, a liquid crystal display glass substrate, a plasma display glass substrate, a field emission display (FED) substrate, an optical disc substrate, a magnetic disc substrate, a magneto-optical disk substrate and the like may be applied as the "substrate" in the embodiment. In the following, a substrate processing apparatus mainly used for processing semiconductor wafers will be described as an example with reference to the drawings, but the same may be applied to the processing of the various substrates exemplified above.

The substrate processing apparatus 1 includes a processing unit 10, a supply unit 50 and a control unit 90. The processing unit 10 is a main body for executing supercritical drying processing, and the supply unit 50 supplies chemical substances and power required for the processing to the processing unit 10.

The control unit 90 controls each part of the apparatus to realize predetermined processing. For this purpose, the control unit 90 includes a CPU 91 for executing various control programs, a memory 92 for temporarily storing processing data, a storage 93 for storing control programs to be executed by the CPU 91, and an interface 94 for exchanging information with users and external apparatuses. Operations of the apparatus to be described later are realized by the CPU 91 executing the control programs written in advance in the storage 93 and causing each part of the apparatus to perform a predetermined operation.

The processing unit 10 includes a processing chamber 100. The processing chamber 100 has a structure in which a plurality of metal blocks 11, 12 and 13 are combined, and their insides form a cavity 105. The internal space of the cavity 105 serves as a processing space SP in which processing on a substrate S is executed. The substrate S to be processed is carried into the processing space SP to undergo processing. A slit-shaped opening 101 which is elongated and extends in the X direction is formed on the side surface of the processing chamber 100 on the (−Y) side, and the processing space SP and the external space communicate with each other through the opening 101.

A lid member 14 is provided on the side surface of the processing chamber 100 on the (−Y) side to close the opening 101. A flat plate-shaped support tray 15 is attached in a horizontal posture to the side surface of the lid member 14 on the (+Y) side, and the upper surface of the support tray 15 is a support surface on which the substrate S may be placed. More specifically, the support tray 15 is provided with a concave part 152 which is formed on a substantially flat upper surface 151 and which is slightly larger than the planar size of the substrate S. By housing the substrate S in the concave part 152, the substrate S is held at a predetermined position on the support tray 15. The substrate S is held with a surface to be processed (hereinafter simply referred to as the "substrate surface") Sa facing upward.

The lid member 14 is supported by a support mechanism (not shown) to be horizontally movable in the Y direction. Further, the lid member 14 may be moved to advance and retreat in the Y direction with respect to the processing chamber 100 by an advancing and retreating mechanism 53 provided in the supply unit 50. Specifically, the advancing and retreating mechanism 53 has a linear motion mechanism, such as a linear motor, a linear motion guide, a ball screw mechanism, a solenoid and an air cylinder, and such a linear motion mechanism moves the lid member 14 in the Y direction. The advancing and retreating mechanism 53 operates in response to a control command from the control unit 90.

By moving the lid member 14 in the (−Y) direction, the support tray 15 is pulled out from the processing space SP through the opening 101. Then, the support tray 15 may be accessed from the outside. That is, the substrate S may be placed on the support tray 15, and the substrate S placed on the support tray 15 may be taken out. On the other hand, by moving the lid member 14 in the (+Y) direction, the support tray 15 is housed in the processing space SP. When the substrate S is placed on the support tray 15, the substrate S is carried into the processing space SP together with the support tray 15.

In supercritical drying processing which may prevent the pattern collapse caused by the surface tension of the liquid, the substrate S is carried in with the surface Sa covered with a liquid film in order to prevent the surface Sa from being exposed and the pattern collapse from occurring. An organic solvent having a relatively low surface tension such as isopropyl alcohol (IPA) or acetone may be suitably used as a liquid forming the liquid film.

By moving the lid member 14 in the (+Y) direction and closing the opening 101, the processing space SP is sealed. A seal member 16 is provided between the side surface of the lid member 14 on the (+Y) side and the side surface of the processing chamber 100 on the (−Y) side to maintain the airtight state of the processing space SP. Further, the lid member 14 is fixed to the processing chamber 100 by a lock mechanism (not shown). In this way, the processing is executed on the substrate S in the processing space SP while the airtight state of the processing space SP is ensured.

In this embodiment, a fluid supply part 57 provided in the supply unit 50 supplies a fluid of a substance that may be used for supercritical processing, such as carbon dioxide, to the processing unit 10 in a gas state or a liquid state. Carbon dioxide is in a supercritical state at a relatively low temperature and low pressure, and has a property of well dissolving an organic solvent often used for substrate processing. In this respect, carbon dioxide is a suitable chemical substance for the supercritical drying processing.

More specifically, the fluid supply part 57 outputs a fluid in a supercritical state or a fluid which is supplied in a gas state or a liquid state and is subsequently put into a supercritical state when given a predetermined temperature and pressure as a processing fluid for processing the substrate S. For example, carbon dioxide in a gas state or a liquid state is output in a pressurized state. The fluid is pressure-fed to an input port 102 provided on the side surface of the processing chamber 100 on the (+Y) side through a pipe 571 and an opening and closing valve 572 inserted in the middle of the pipe 571. That is, the opening and closing valve 572 is opened in response to the control command from the control unit 90, whereby the fluid is sent from the fluid supply part 57 to the processing chamber 100.

A flow path 17 of the fluid from the input port 102 to the processing space SP has a first flow path 171, a buffer part 175, and a second flow path 172. The first flow path 171 is a flow path having a constant cross-sectional area and guides the fluid pressure-fed from the fluid supply part 57 to the input port 102 to the buffer part 175. The buffer part 175 is a space formed so that the flow path cross-sectional area is abruptly increased as compared with the first flow path 171.

Even in the case where the fluid is supplied as a liquid, it may vaporize and expand in the flow path due to the fluctuation in pressure loss in the flow path and the like. If such abrupt expansion occurs near the substrate S, the substrate S may be damaged. In order to avoid this, a part in which the pressure loss fluctuates greatly is provided in a part of the flow path 17 that reaches the processing space SP, and possible vaporization and expansion occur in this part. The buffer part 175 is provided as a space for this. Further, the buffer part 175 also has a rectifying function for allowing the fluid flowing through the first flow path 171 in a tubular shape to be supplied in a thin layer shape to the processing space SP as described later.

The second flow path 172 guides the fluid from the buffer part 175 to the processing space SP. Specifically, the second flow path 172 is a flow path that connects the internal space of the buffer part 175 and the processing space SP, and the flow path cross-sectional area thereof is smaller than that of the buffer part 175. The second flow path 172 has a horizontally long cross-sectional shape that is narrow in the vertical direction (the Z direction) and wide in the horizontal direction (the X direction). When the fluid passes through the second flow path 172, a flow in a thin layer shape is formed.

The (−Y) side end part of the second flow path 172 opens toward the processing space SP to form a discharge port 176. More specifically, the discharge port 176 opens on the side wall surface of the cavity 105 on the (+Y) side, and the second flow path 172 communicates with the processing space SP through the discharge port 176. The opening shape and the opening size of the discharge port 176 are identical to the opening shape and the opening size of the second flow path 172. Further, the opening position of the discharge port 176 is provided on the extension line of the second flow path 172. Therefore, the fluid flowing in a thin layer shape in the second flow path 172 is discharged to the processing space SP while maintaining its shape and flow rate.

The fluid supplied through the flow path 17 is filled in the processing space SP, and when the inside of the processing space SP reaches an appropriate temperature and pressure, the fluid enters a supercritical state. In this way, the substrate S is processed by the supercritical fluid in the processing chamber 100. The supply unit 50 is provided with a fluid recovery part 55, and the fluid after the processing is recovered by the fluid recovery part 55. The fluid supply part 57 and the fluid recovery part 55 are controlled by the control unit 90.

More specifically, an output port 103 communicating with the processing space SP is provided above the processing chamber 100. The output port 103 is connected to the fluid recovery part 55 through a pipe 551 and an opening and closing valve 552 inserted in the middle of the pipe 551. The opening and closing valve 552 is opened in response to the control command from the control unit 90, whereby the fluid in the processing space SP is sent to the fluid recovery part 55 and recovered. A flow path from the processing space SP to the output port 103 is provided further on the (−Y) side than the end part of the substrate S in the (−Y) direction. Hereinafter, this flow path is referred to as a "third flow path" and is denoted by the reference numeral 173.

Figure 2:
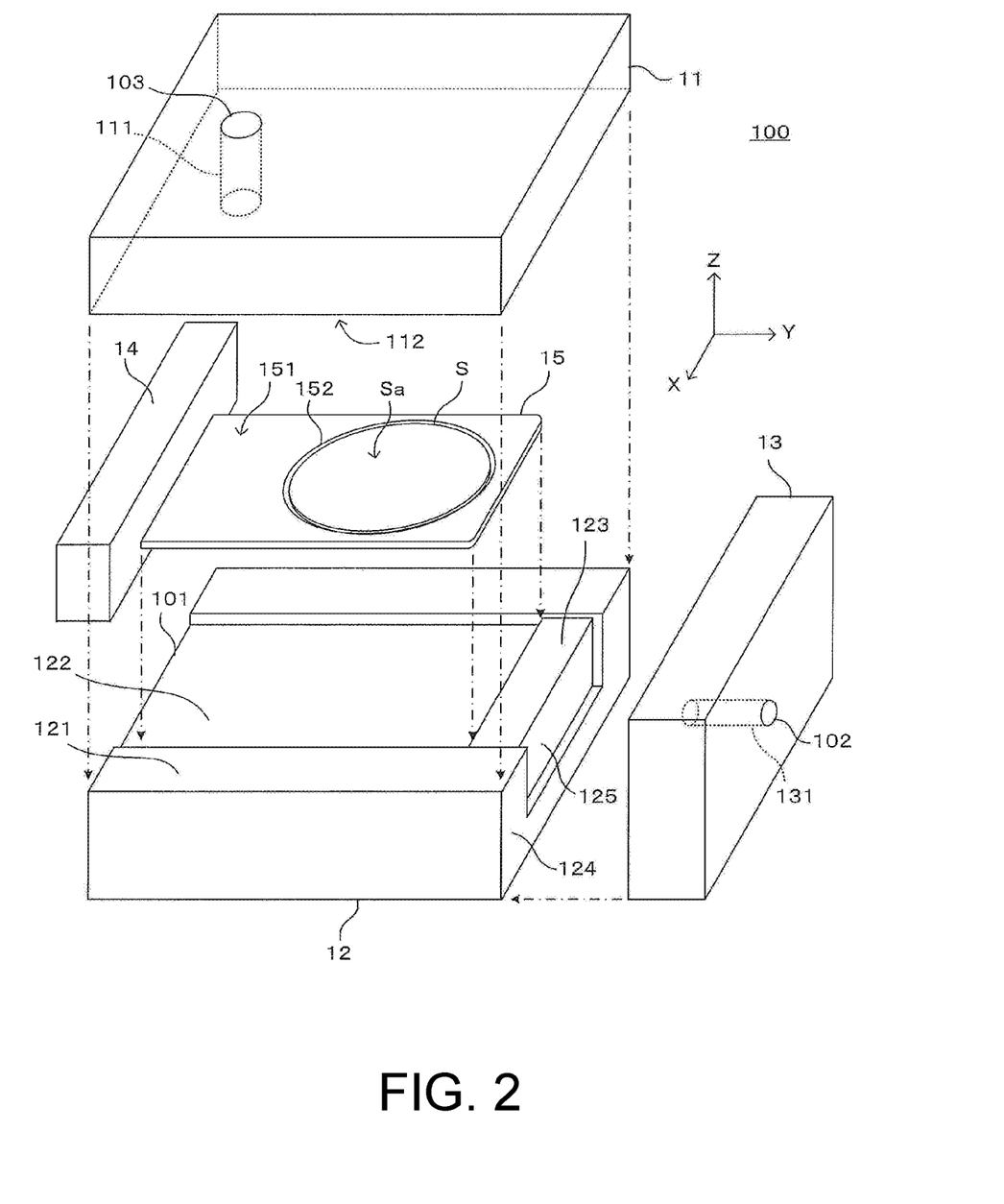
FIG. 2 is an exploded view showing a structure of the processing chamber.

FIG. 2 is an exploded view showing a structure of the processing chamber. The processing chamber 100 includes a first member 11, a second member 12 and a third member 13 each formed by a metal block. The first member 11 and the second member 12 are combined in the vertical direction by a combining member (not shown), and the side surfaces of the first member 11 and the second member 12 on the (+Y) side are combined to the third member 13 by a combining member (not shown) to form the processing chamber 100.

The first member 11 is a thick plate-shaped member whose main surfaces are surfaces parallel to the XY plane and is provided with a through hole 111 penetrating between the two main surfaces in the vertical direction. The through hole 111 forms the third flow path 173 and the output port 103. Further, as described later, a lower surface 112 of the first member 11 functions as the ceiling surface of the cavity 105 that surrounds the processing space SP. Further, the third member 13 is a thick plate-shaped member whose main surfaces are surfaces parallel to the XZ plane and is provided with a through hole 131 penetrating between the two main surfaces in the Y direction. The through hole 131 forms the first flow path 171 and the input port 102.

The second member 12 has a more complicated shape in order to form the flow path 17 of the fluid as described above. That is, the central part of the upper surface 121 of the second member 12 is provided with a concave part 122 whose upper part is closed by the first member 11 to form the processing space SP. The concave part 122 is formed to correspond to the shape of the support tray 15. Specifically, the shape of the concave part 122 in a plan view is substantially similar to the shape of the support tray 15, and the planar size thereof is slightly larger than the planar size of the support tray 15. Further, the depth of the concave part 122 is slightly larger than the thickness of the support tray 15.

The concave part 122 extends to the end part of the second member 12 on the (−Y) side with a constant depth. Since the upper part of the concave part 122 is closed by the first member 11, the end part of the concave part 122 on the (−Y) side functions as the opening 101 for putting in and taking out the support tray 15.

A step part 123 having a depth from the upper surface 121 smaller than that of the concave part 122 is provided adjacent to the end part of the concave part 122 on the (+Y) side. The gap between the first member 11 and the second member 12, which is formed by closing the upper part of the step part 123 by the first member 11, forms the second flow path 172. Further, the boundary part between the concave part 122 and the step part 123 forms the discharge port 176.

A side surface 124 of the second member 12 on the (+Y) side is provided with a concave part 125 whose surface recedes to the (−Y) side from the side surface 124. The upper side of the concave part 125 is closed by the first member 11 and the (+Y) side thereof is closed by the third member 13 to form a surrounded space, and this space serves as the buffer part 175. The through hole 131 of the third member 13 is provided at a position facing the buffer part 175 formed in this way and functions as the first flow path 171.

Figure 3:
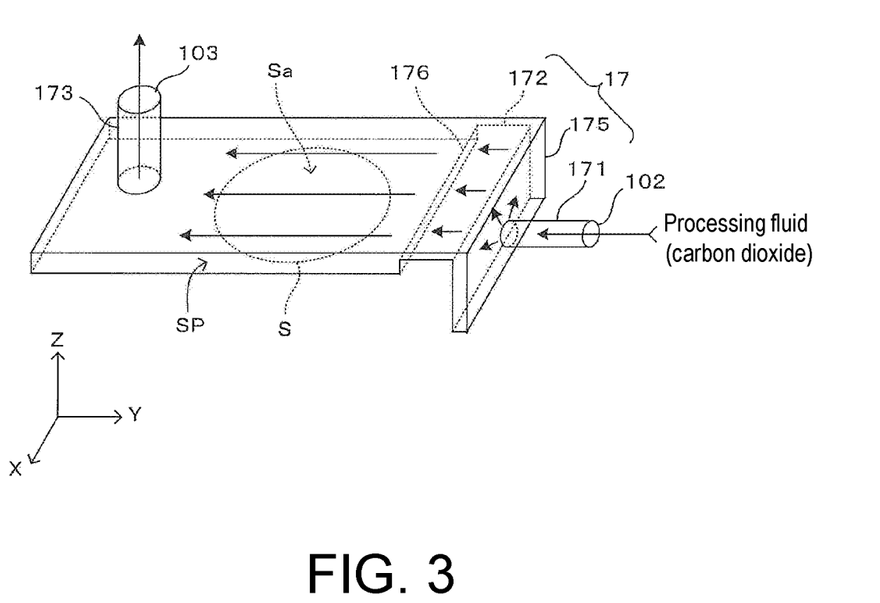
FIG. 3 is a view showing the flow path of the fluid.

FIG. 3 is a view showing the flow path of the fluid. More specifically, FIG. 3 is a schematic view showing the shape of the flow path of the fluid formed in the processing chamber 100 having the above structure. In the figure, arrows indicate the flow direction of the fluid. The processing fluid (such as carbon dioxide in a gas state or a liquid state) pressure-fed from the fluid supply part 57 flows through the flow path 17 and the processing space SP in the processing chamber 100, and finally passes through the third flow path 173 and is discharged from the output port 103 to the outside of the chamber.

The fluid flowing from the input port 102 into the first flow path 171 flows in the first flow path 171 in the (−Y) direction and then flows into the buffer part 175. In the buffer part 175, the fluid spreads in the surfaces parallel to the XZ plane and flows into the second flow path 172 at the upper part of the buffer part 175. The fluid becomes a thin layer in the second flow path 172 and is discharged from the discharge port 176 into the processing space SP. In order to form a flow uniform in the width direction in the processing space SP, it is preferable that the second flow path 172, the discharge port 176, and the processing space SP have the same width, that is, have the same size in the X direction.

Here, as may be seen from FIG. 1 and FIG. 3, the flow directions of the fluid in the first flow path 171 and the second flow path 172 provided with the buffer part 175 sandwiched therebetween are both the (−Y) direction. However, these flow paths are disposed at different positions in the Z direction. In other words, the opening positions of the first flow path 171 and the second flow path 172 that respectively open toward the buffer part 175 do not overlap with each other in the Z direction. Specifically, the first flow path 171 is connected to a substantially central part of the buffer part 175 in the vertical direction in a side view. On the other hand, the second flow path 172 is connected to the upper end part of the buffer part 175.

In this way, the flow direction of the fluid in the flow path 17 is as follows. That is, the fluid that has advanced in the (−Y) direction through the first flow path 171 advances upward in the buffer part 175, that is, in the (+Z) direction, and flows again in the (−Y) direction when flowing into the second flow path 172. Therefore, the fluid flowing into the first flow path 171 changes the flow direction of the fluid for a plurality of times before being discharged into the processing space SP through the buffer part 175. The reason for such a structure is as follows.

As described above, when the fluid is supplied in a liquid state, it may vaporize in the flow path 17, particularly in the buffer part 175, and expand abruptly. At this time, the impact caused by the abrupt expansion may adversely influence the substrate S in the processing space SP. In particular, if the flow path from the first flow path 171 to the second flow path 172 is in a straight line, in other words, if the first flow path 171 may be seen from the discharge port 176 through the second flow path 172, there is a risk that the impact caused by the expansion of the fluid that has flowed from the first flow path 171 into the buffer part 175 may directly reach the processing space SP through the second flow path 172.

In the embodiment, the first flow path 171 and the second flow path 172 are disposed at different positions in the Z direction; in other words, it is a structure in which the first flow path 171 may not be seen from the discharge port 176. In this way, the impact caused by the abrupt expansion of the fluid near the outlet of the first flow path 171 may be prevented from immediately reaching the processing space SP. As described above, the structure of the flow path 17 in the embodiment has a function of suppressing the impact caused by the abrupt expansion of the liquid from being propagated to the processing space SP and preventing the damage of the substrate S caused by the impact. In order to reliably prevent the propagation of the impact, the magnitude of change in the flow direction of the fluid is preferably 90 degrees or more.

In the processing space SP, the fluid passes through the gap between the lower surface 112 of the first member 11, which is the ceiling surface of the processing space SP, and the support tray 15 and the substrate S housed in the processing space SP. The upper surface 151 of the support tray 15, the upper surface (surface) Sa of the substrate S, and the ceiling surface 112 of the processing space SP are all flat surfaces. Therefore, the fluid passes through the gap space formed by these surfaces facing one another. As described below, this embodiment is configured to form a laminar flow in which the fluid discharged from the discharge port 176 flows along the upper surface Sa of the substrate S.

Figure 4A:
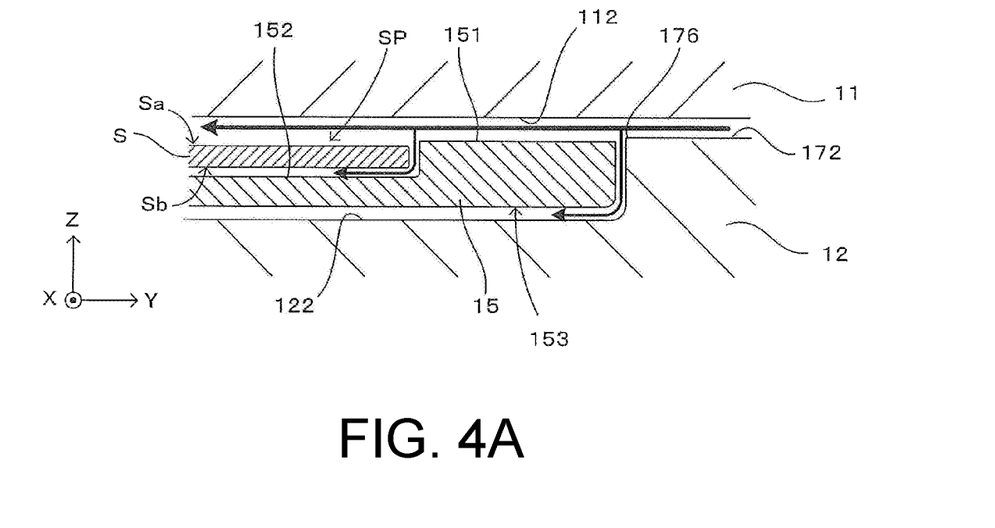
FIG. 4A is a view explaining the inventors' findings regarding a good effect of the laminar flow.
Figure 4B:
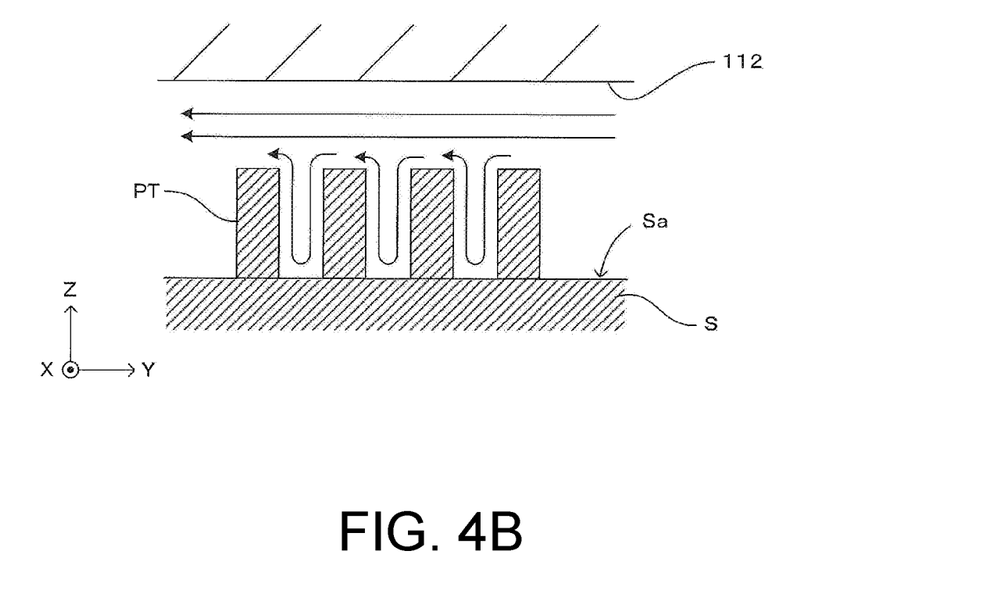
FIG. 4B is a view explaining the inventors' findings regarding a good effect of the laminar flow.

FIGS. 4A and 4B are views explaining the inventors' findings regarding a good effect of the laminar flow. In the figures, the arrows schematically indicate the flow direction of the fluid. As shown in FIG. 4B, particularly when a fine pattern PT is formed on the substrate surface Sa, if the fluid may flow between the ceiling surface 112 of the processing space SP and the substrate surface Sa as a laminar flow with little turbulence, a part of the fluid enters the gaps among the pattern PT to facilitate stirring in the pattern. As a result, the processing fluid and the deposits remaining in the deep part of the pattern are scraped out to the surface, whereby the efficiency of the processing of removing these residues from the substrate surface Sa may be improved.

Further, since the residues released from the substrate surface Sa are carried in one direction, in the (−Y) direction in this example, by the laminar flow, they are prevented from staying on the periphery of the substrate surface Sa and redepositing. As described above, flowing the processing fluid as a laminar flow along the substrate surface Sa has great significance in improving the processing efficiency and processing the substrate well.

Here, as shown in FIG. 4A,
(1) a gap between the substrate surface Sa and the ceiling surface 112 of the processing space SP,
(2) a gap between a back surface (lower surface) Sb of the substrate S and the support surface 152 of the support tray 15, and
(3) a gap between a lower surface 153 of the support tray 15 and the bottom surface (concave part 122) of the processing space SP,
may be considered to be the paths of the fluid supplied from the discharge port 176 to the processing space SP through the second flow path 172. Of these, the flow of (1) contributes to the processing of the substrate surface Sa, and the others do not directly contribute to the processing.

Therefore, in order to perform the processing efficiently and well, it is preferable that the supplied fluid is allowed to flow through the path (1) as much as possible, and that the flow forms a laminar flow. According to the knowledge of the inventors of the disclosure, it is preferable that more than half of the fluid discharged from the discharge port 176 flows through the path (1). The size relationship of each part for realizing this will be described below.

Figure 5A:
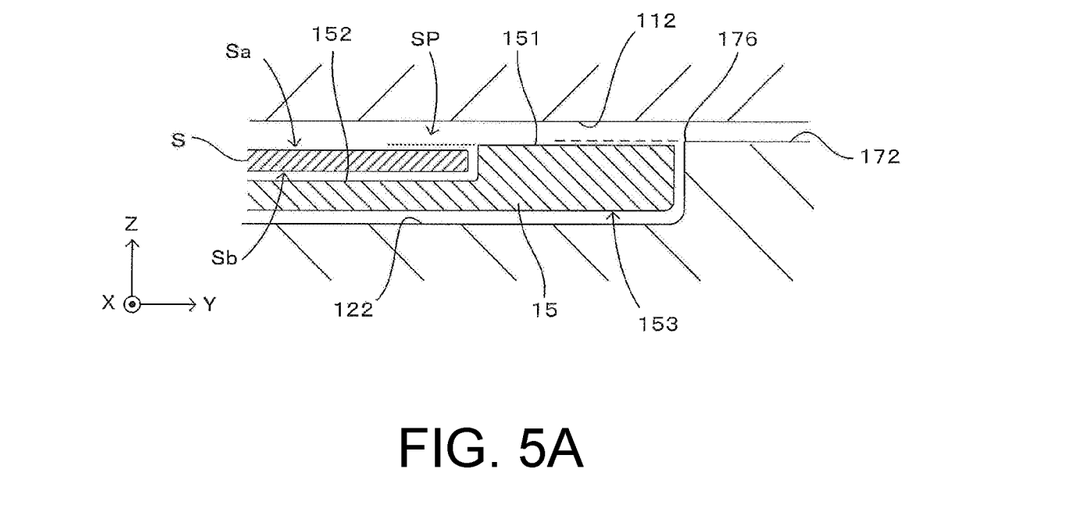
FIG. 5A is a view showing the size relationship of each part.
Figure 5B:
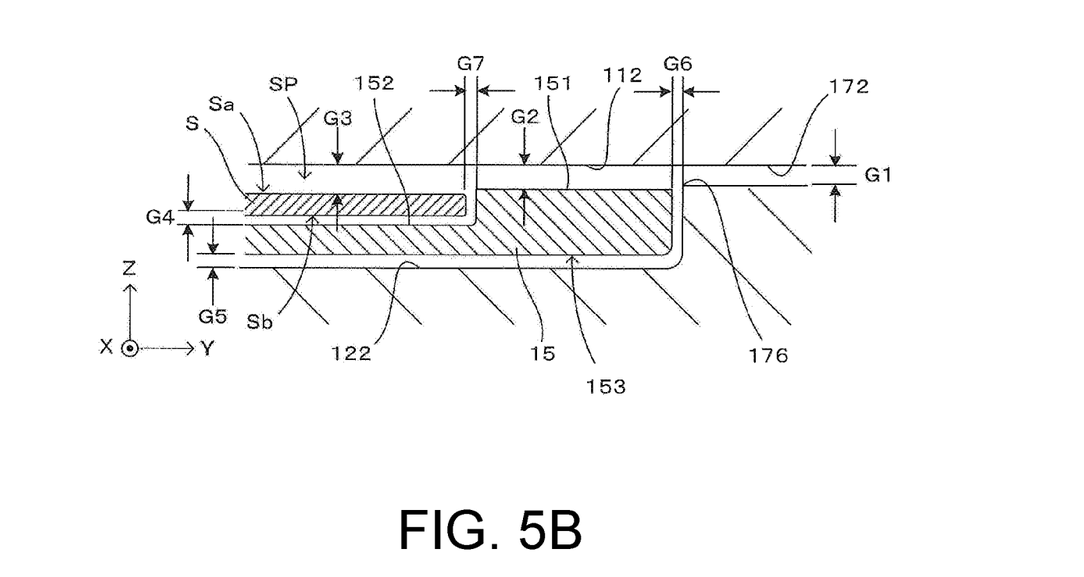
FIG. 5B is a view showing the size relationship of each part.

FIGS. 5A and 5B are views showing the size relationship of each part. The positional relationship of each part in the vertical direction will be described with reference to FIG. 5A. First, consider the condition for preventing a turbulent flow from being generated at the time when the fluid is discharged from the discharge port 176. For this purpose, it is preferable that there is no obstacle in front of the flow direction of the fluid discharged horizontally from the discharge port 176. The condition for this is that the upper surface 151 of the support tray 15 is at a height equal to or lower than the lower end position of the discharge port 176 shown by the broken line in FIG. 5A. In this way, the discharged fluid may be prevented from colliding with the side surface of the support tray 15 and generating a turbulent flow.

Further, it is preferable that the ceiling surface of the flow path also has a continuously smooth shape from the second flow path 172 to the processing space SP. In the embodiment, since the ceiling surface continuous from the second flow path 172 to the processing space SP is formed by the flat lower surface 112 of the first member 11, the ceiling surface of the flow path is a single plane. Therefore, a turbulent flow is prevented from being generated on the ceiling surface side.

Ideally, it is preferable that a flow path having a uniform cross-sectional shape like the second flow path 172 continues also in front of the discharge port 176. The condition for this is that the ceiling surface of the flow path from the second flow path 172 to the processing space SP is a single plane as described above, and that the lower end position of the discharge port 176 and the position of the upper surface 151 of the support tray 15 are the same in the Z direction.

Further, in order that a turbulent flow is not generated in the flow path from the upper surface 151 of the support tray 15 to the substrate surface Sa, it is preferable that the position of the substrate surface Sa in the vertical direction is the same as or lower than the position of the upper surface 151 of the support tray 15 as shown by the dotted line.

Next, the size relationship of each part for making the flow quantity distribution of the fluid in the above paths (1) to (3) appropriate will be described with reference to FIG. 5B. The size of each part is defined as shown in FIG. 5B. That is, the gap between the ceiling surface and the bottom surface of the second flow path 172 is denoted by the reference numeral G1. Similarly, the gap between the ceiling surface 112 of the processing space SP and the upper surface 151 of the support tray 15 is denoted by the reference numeral G2; the gap between the ceiling surface 112 and the substrate surface Sa is denoted by the reference numeral G3; the gap between the substrate lower surface Sb and the surface of the concave part 152 of the support tray 15 is denoted by the reference numeral G4; and the gap between the lower surface 153 of the support tray 15 and the bottom surface 122 of the processing space SP is denoted by the reference numeral G5, respectively.

Further, the gap in the Y direction between the side surface of the support tray 15 and the side wall surface of the cavity 105, that is, the gap between the (+Y) side end surface of the support tray 15 and the (+Y) side wall surface of the cavity 105 is denoted by the reference numeral G6. Further, the gap in the Y direction between the substrate S and the support tray 15, that is, the gap between the (+Y) side end surface of the substrate S and the (+Y) side end surface of the concave part 152 of the support tray 15 is denoted by the reference numeral G7. In addition, each gap in the figure is exaggerated, and the size thereof does not necessarily reflect the actual size.

In order to supply most of the fluid discharged from the discharge port 176 to the upper surface side of the support tray 15 and to reduce the fluid wrapping around to the lower surface side, it is preferable that $G2 \geq G1$ and $G2 > G6$. For example, it may be set that $G2=G1$ and $G2 >> G6$. Further, in order to supply the fluid flowing along the upper surface 151 of the support tray 15 to the substrate surface Sa as much as possible and to suppress the fluid from wrapping around to the substrate back surface Sb side, it is preferable that $G3 \geq G2$ and $G3 > G7$. For example, it may be set that $G3 = G2$ and $G3 >> G7$. Further, from the viewpoint of suppressing the wraparound of the fluid by narrowing the flow path, it is preferable that the relationship of $G2 \geq G5$ and $G3 \geq G4$ is established.

For an example of the sizes, when the flow quantity is obtained by computer simulation with $G1=1.0$ [mm], $G2=G3=G4=G5=2.0$ [mm], $G6=0.5$ [mm], and $G7=1.0$ [mm], the flow quantity ratio of the fluids flowing through the paths (1) to (3) is 5:3:2. As described above, by using, for example, computer simulation, the size of each part may be optimized so that the distribution of the flow quantity flowing in each path is appropriate. According to the knowledge of the inventors of the disclosure, it is appropriate that the above sizes are several mm or less.

It is effective to make the above gaps G4 and G5 smaller in the respect of further suppressing the wraparound to the substrate lower surface and the lower surface of the support tray. However, since there is a high risk of contact between members that may occur due to being put in and taken out of the processing space SP or application of pressure, it is not realistic to make them too small. Further, the gaps G6 and G7 between the members in the Y direction are only limited by the machining accuracy of each member. Therefore, the distribution of the flow quantity may be appropriately set by managing these gaps.

The fluid that has flowed in the processing space SP in this way is discharged to the outside through the third flow path 173 for discharging provided on the downstream side of the rear end part of the substrate S in the flow direction (the (−Y) direction in this example), that is, through the through hole 111 and the output port 103 (see FIG. 3). Therefore, the laminar flow of the fluid formed along the substrate surface Sa is maintained at least until the rear end part of the substrate S. In this way, the substrate surface Sa may be processed uniformly. Further, since the residues released from the substrate S are carried to the downstream side of the substrate S by the laminar flow and then discharged, redepositing on the substrate is suppressed.

As described above, in the substrate processing apparatus 1 of the embodiment, the substrate S is stored in the processing chamber 100 in a state of being placed on the flat plate-shaped support tray 15. The cavity 105, which is slightly larger than the outer shape of the support tray 15, is provided in the processing chamber 100, and the inside thereof serves as the processing space SP. Although the processing fluid is supplied from the side of the substrate S stored in the processing space SP, the positional relationship between the discharge port 176 and the support tray 15 is set so that the lower end position of the opening of the discharge port 176 is the same as or higher than the position of the upper surface 151 of the support tray 15 in the vertical direction.

In this way, the fluid discharged in the horizontal direction from the discharge port 176 may be suppressed from colliding with the side surface of the support tray 15 to generate a turbulent flow, and a laminar flow of the fluid along the upper surface 151 of the support tray 15 may be formed. Since such a laminar flow flows along the substrate surface Sa, in this embodiment, the processing on the substrate surface Sa may be performed efficiently and well.

As described above, in the above embodiments, the processing chamber 100 functions as the "storage container" of the disclosure, and the processing space SP inside thereof corresponds to the "internal space" of the disclosure. Further, the third flow path 173 including the through hole 111 and the output port 103 functions as the "discharge flow path" of the disclosure.

In addition, the disclosure is not limited to the above-described embodiments, and various modifications other than those described above may be made without departing from the spirit of the disclosure. For example, the discharge port 176 in the above embodiments is a slit-shaped opening formed wider than the width (the length in the X direction) of the substrate S. However, instead of such a single opening, it may be configured that a plurality of openings may be arranged in the X direction to discharge the fluid in a thin layer as a whole. The same applies to the third flow path 173 for discharge, and for example, the third flow path 173 may include a slit-shaped through hole extending in the X direction or a plurality of through holes arranged in the X direction. In this way, the laminar flow flowing through the processing space SP may be discharged as it is without being turbulent.

Further, for example, the flow path 17 of the above embodiments is configured such that the buffer part 175 is provided in the middle of the flow path 17 and that the flow direction of the fluid changes in the flow paths before and after the buffer part 175. However, the shape of the flow path is not limited to the above and may be any shape as long as a flow in a thin layer shape and in the horizontal direction is formed at least in front of the discharge port.

Further, various chemical substances used in the processing of the above embodiments are only some examples, and various things may be used instead of the above chemical substances as long as they are in accordance with the technical idea of the disclosure.

As described above by exemplifying with the specific embodiments, in the substrate processing apparatus according to the disclosure, for example, it may be configured that the concave part has a depth so that a position in the vertical direction of the surface of the substrate housed in the concave part is the same as or lower than the position of the upper surface of the support tray. According to such a configuration, the upper surface of the substrate housed in the concave part is located lower than the upper surface of the support tray around the concave part. Therefore, the processing fluid flowing along the upper surface of the support tray may be prevented from colliding with the end surface of the substrate to generate a turbulent flow, and a laminar flow with little turbulence on the substrate surface may be formed.

Further, for example, an upper end position of the discharge port in the vertical direction may be the same as a position of the ceiling surface. According to such a configuration, the processing fluid discharged from near the upper end of the discharge port may smoothly flow along the ceiling surface as it is, and the generation of a turbulent flow may be suppressed.

Further, for example, the discharge port may have a shape which opens in a slit shape which extends horizontally along the wall surface of the cavity. According to such a configuration, the processing fluid discharged in a thin layer shape from the slit-shaped discharge port may be supplied to the surface of the substrate as it is.

In this case, a size of an opening of the discharge port in the horizontal direction may be larger than a size of the substrate in the horizontal direction parallel to the opening of the discharge port. According to such a configuration, the processing fluid may be supplied as a uniform laminar flow to the entire substrate.

Further, for example, in a state where the support tray is stored in the internal space, a distance between the ceiling surface of the cavity and the upper surface of the support tray may be equal to or larger than a distance between the side wall surface provided with the discharge port and a side surface of the support tray. According to such a configuration, most of the processing fluid discharged from the discharge port may be sent to the upper surface of the support tray, and the processing fluid wrapping around to the lower surface of the support tray may be reduced. Therefore, the processing efficiency with respect to the quantity of the processing fluid used may be improved.

Further in this case, for example, the distance between the ceiling surface of the cavity and the upper surface of the support tray may be equal to or larger than a distance between a bottom surface of the cavity and a lower surface of the support tray. According to such a configuration, since the flow path on the upper surface side of the support tray is wider than the flow path on the lower surface side, the processing fluid that wraps around to the lower surface side of the support tray may be further reduced.

Alternatively, for example, the distance between the ceiling surface of the cavity and the upper surface of the support tray may be larger than a distance between a lower surface of the substrate housed in the concave part and an upper surface of the concave part. According to such a configuration, the quantity of the processing fluid that wraps around to the lower surface side of the substrate may be reduced, and more of the processing fluid may be supplied to the surface of the substrate.

Further, for example, the cavity may have an opening toward an external space of the storage container on an opposite side of the discharge port with the internal space sandwiched therebetween, and the support tray is capable of being put in and taken out through the opening. According to such a configuration, the substrate may be carried in and carried out through the opening. Since the opening for carrying in and carrying out the substrate is provided on the opposite side of the discharge port with the internal space sandwiched therebetween, it is not necessary to dispose a movable part in the periphery of the discharge port. As a result, the positional relationship between the support tray or the substrate supported by the support tray and the discharge port may be stabilized, and a stable laminar flow may be formed.

Further, for example, a discharge port which discharges the processing fluid may be provided on an opposite side to the discharge port with the internal space sandwiched therebetween. According to such a configuration, the processing fluid is discharged after passing through the substrate stored in the internal space. Therefore, the substances released from the substrate may be effectively prevented from redepositing on the substrate due to a convective flow or a turbulent flow of the processing fluid.

Further, for example, the substrate processing apparatus of the disclosure processes the substrate with the processing fluid in a supercritical state. According to such a configuration, the supercritical fluid may be supplied to the surface of the substrate as a laminar flow, and the substrate may be processed efficiently and well.

The disclosure may be applied to all substrate processing apparatuses that process a surface of a substrate with a processing fluid. In particular, it may be applied to substrate drying processing for drying a substrate such as a semiconductor substrate with a supercritical fluid.

Although the disclosure has been described with reference to specific embodiments, this description is not meant to be construed in a limiting sense. Various modifications of the disclosed embodiment, as well as other embodiments of the present disclosure, will become apparent to persons skilled in the art upon reference to the description of the disclosure. It is therefore contemplated that the appended claims will cover any such modifications or embodiments as fall within the true scope of the disclosure.

What is claimed is:

1. A substrate processing apparatus which processes a surface of a substrate with a processing fluid, the substrate processing apparatus comprising:
   a support tray having a flat plate shape which includes an upper surface having a substantially flat surface and a concave part recessing from the upper surface for housing the substrate;
   a storage container in which a cavity having a shape corresponding to an outer shape of the support tray and having a ceiling surface that is a horizontal plane is formed, wherein the support tray housing the substrate in the concave part is capable of being stored in a horizontal posture in an internal space of the cavity through an opening formed on a side surface of the storage container; and
   a fluid supply part which supplies the processing fluid to the cavity,
   wherein the storage container is provided with a flow path which receives the processing fluid supplied from the fluid supply part and which discharges the processing fluid in a horizontal direction into the cavity from a discharge port that opens on a side wall surface of the cavity and toward the cavity, and
   a lower end position of the discharge port in a vertical direction is the same as or higher than a position of the upper surface of the support tray stored in the cavity.

2. The substrate processing apparatus according to claim 1, wherein the concave part has a depth so that a position in the vertical direction of the surface of the substrate housed in the concave part is the same as or lower than the position of the upper surface of the support tray.

3. The substrate processing apparatus according to claim 1, wherein an upper end position of the discharge port in the vertical direction is the same as a position of the ceiling surface.

4. The substrate processing apparatus according to claim 1, wherein the discharge port opens in a slit shape which extends horizontally along the wall surface of the cavity.

5. The substrate processing apparatus according to claim 4, wherein a size of an opening of the discharge port in the horizontal direction is larger than a size of the substrate in the horizontal direction parallel to the opening of the discharge port.

6. The substrate processing apparatus according to claim 1, wherein in a state where the support tray is stored in the internal space, a distance between the ceiling surface of the cavity and the upper surface of the support tray is equal to or larger than a distance between the side wall surface provided with the discharge port and a side surface of the support tray.

7. The substrate processing apparatus according to claim 6, wherein the distance between the ceiling surface of the cavity and the upper surface of the support tray is equal to or larger than a distance between a bottom surface of the cavity and a lower surface of the support tray.

8. The substrate processing apparatus according to claim 6, wherein the distance between the ceiling surface of the cavity and the upper surface of the support tray is larger than a distance between a lower surface of the substrate housed in the concave part and an upper surface of the concave part.

9. The substrate processing apparatus according to claim 1, wherein the cavity has the opening toward an external space of the storage container on an opposite side of the discharge port with the internal space sandwiched therebetween, and the support tray is capable of being put in and taken out through the opening.

10. The substrate processing apparatus according to claim 1, further comprising a discharge flow path which communicates with the internal space on an opposite side to the discharge port with respect to the substrate and which discharges the processing fluid to outside.

11. The substrate processing apparatus according to claim 1, wherein the substrate processing apparatus processes the substrate with the processing fluid in a supercritical state.

* * * * *